(12) United States Patent
Huang et al.

(10) Patent No.: US 11,658,270 B2
(45) Date of Patent: May 23, 2023

(54) LIGHT EMITTING DIODE AND LIGHT PURIFICATION METHOD THEREFOR

(71) Applicant: CHONGQING KONKA PHOTOELECTRIC TECHNOLOGY RESEARCH INSTITUTE CO., LTD., Chongqing (CN)

(72) Inventors: Chia-Hung Huang, Chongqing (CN); Kuo-Tung Huang, Chongqing (CN); Mao-Chia Hung, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 9 days.

(21) Appl. No.: 17/527,656

(22) Filed: Nov. 16, 2021

(65) Prior Publication Data

US 2022/0077351 A1   Mar. 10, 2022

Related U.S. Application Data

(63) Continuation of application No. PCT/CN2020/085887, filed on Apr. 21, 2020.

(51) Int. Cl.
*H01L 33/46* (2010.01)
*H01L 33/00* (2010.01)

(52) U.S. Cl.
CPC .......... *H01L 33/46* (2013.01); *H01L 33/0075* (2013.01)

(58) Field of Classification Search
CPC ..................................................... H01L 33/46
See application file for complete search history.

(56) References Cited

U.S. PATENT DOCUMENTS

2005/0173714 A1   8/2005   Lee et al.

FOREIGN PATENT DOCUMENTS

| CN | 1680851 A | 10/2005 |
| CN | 102044608 A | 5/2011 |
| CN | 103904182 A | 7/2014 |
| CN | 104465928 A | 3/2015 |
| TW | 201133947 A1 | 10/2011 |

OTHER PUBLICATIONS

The International Search Report issued in corresponding International Application No. PCT/CN2020/085887, dated Jan. 21, 2021.
Klein Koerkamp, K.J. et al. "Strong Influence of Hole Shape on Subwavelength", Holes Physical Review Letters, May 7, 2004 (May 7, 2004), vol. 92, Issue 18, pp. 183901-1 to 183901-4.

*Primary Examiner* — Joseph L Williams
(74) *Attorney, Agent, or Firm* — Hauptman Ham, LLP

(57) ABSTRACT

A light emitting diode (LED) and a light purification method therefor are provided, which belong to the technical field of LED. The LED includes an epitaxial structure and a light purification layer plated on the epitaxial structure. The light purification layer includes a first reflection layer and defines multiple light-exiting holes. The first reflection layer is plated on the epitaxial structure. The multiple light-exiting holes each extend through the first reflection layer and have an aperture which is N times a preset wavelength of an exit light, N being an integer and N≥1.

16 Claims, 4 Drawing Sheets

LIGHT EMITTING DIODE AND LIGHT PURIFICATION METHOD THEREFOR

CROSS-REFERENCE TO RELATED APPLICATION (S)

This application is a continuation of International Application No. PCT/CN2020/085887, filed on Apr. 21, 2020, the disclosure of which is hereby incorporated by reference in its entirety.

TECHNICAL FIELD

This disclosure relates to the technical field of light emitting diode (LED), and in particular to an LED and a light purification method therefor.

BACKGROUND

With the rapid development of light emitting diode (LED) technology, LEDs are more and more widely used in various fields. Under such a development situation, people have higher and higher requirements for the color displayed by display devices, and many experts and scholars continue to propose new materials and new structures that help improve the purity of light.

In terms of current white LEDs, blue light is matched with YAG phosphor to obtain the required white light. Blue lights with different wavelengths must be matched with different proportions of phosphors to obtain the white light of the same color. For example, the mixed white light with a wavelength of 455 nm and the mixed white light with a wavelength of 450 nm require different proportions of phosphors, so that the white light is controlled at the color coordinate position of CIE X=0.33 Y=0.33. Taking 450 nm blue light as an example, it contains lights with wavelengths between 442 mm-458 nm, but the light with a wavelength of 450 nm is the brightest. Therefore, the phosphor will be blended for 450 nm to achieve a best effect. However, the light with a wavelength of 442 nm, which has a low intensity, also excites the phosphor, so that the generated white light will deviate from the required coordinate position. As a result, the white light seen by the human eye will be colder. On the other hand, if the light with a wavelength of 458 nm is relatively bright, the white light will become warmer. As such, if the half-width of the LED light can be controlled to be narrower, such as between 448 nm-452 nm, the color cast is hard to be perceived by the human eye. Three primary colors of micro-LED excites into white light differently from the conventional exciting way of blue light+YAG phosphor, where the purer the color required, that is, the narrower the half-width, the higher the color rendering index.

Therefore, the existing structure of the LED chip cannot meet the requirement on exciting of micro-LED, so that it is necessary to provide an optical structure that can improve the purity of light of LED and reduce color cast.

SUMMARY

In a first aspect, the implementations of the disclosure provide an LED. The LED includes an epitaxial structure and a light purification layer plated on the epitaxial structure. The light purification layer includes a first reflection layer and defines multiple light-exiting holes. The first reflection layer is plated on the epitaxial structure. The multiple light-exiting holes each extend through the first reflection layer and have an aperture which is N times a preset wavelength of an exit light, N being an integer and N≥1.

In some implementations, the first reflection layer is an aluminum (Al) layer.

In some implementations, the light purification layer further includes a second reflection layer plated on the first reflection layer, and the multiple light-exiting holes each extend through the second reflection layer and the first reflection layer.

In some implementations, the second reflection layer is an aluminum nitride (AlN) layer.

In some implementations, the second reflection layer has a height greater than the first reflection layer.

In some implementations, the first reflection layer is an AlN layer.

In some implementations, the light purification layer further includes a second reflection layer plated on the first reflection layer, and the multiple light-exiting holes each extend through the second reflection layer and the first reflection layer.

In some implementations, the second reflection layer is an Al layer.

In some implementations, the second reflection layer has a height less than the first reflection layer.

In some implementations, the second reflection layer has a thickness of 20-40 um.

In some implementations, the light-exiting holes are circular.

In some implementations, the exit light output from the light-exiting holes has a wavelength of 458 nm~462 nm.

In some implementations, a distance between two adjacent light-exiting holes is not equal to N times a preset wavelength of an exit light, N being an integer and N≥1.

In a second aspect, the implementations of the disclosure provide a light purification method for an LED. The method includes forming a light purification layer on an epitaxial structure of the LED and patterning the light purification layer to form multiple light-exiting holes each extending through the light purification layer. Each of the multiple light-exiting holes has an aperture which is N times a preset wavelength of an exit light, N being an integer and N≥1.

In some implementations, the light purification layer is formed on the epitaxial structure of the LED as follows. A first reflection layer is plated on the epitaxial structure of the LED, and a second reflection layer is plated on the first reflection layer to form the light purification layer.

In some implementations, the light purification layer is patterned to form the multiple light-exiting holes as follow. The second reflection layer and the first reflection layer are patterned to form the multiple light-exiting holes each extending through the second reflection layer and the first reflection layer. The multiple light-exiting holes each have an aperture which is N times the preset wavelength of the exit light, N being an integer and N≥1.

BRIEF DESCRIPTION OF THE DRAWINGS

In order to explain the technical solutions of the implementations of the present disclosure more clearly, the following will briefly introduce the drawings needed in the implementations. Obviously, the drawings in the following description are only some implementations of the present disclosure. For those of ordinary skill in the art, other drawings can be obtained from these drawings without creative work.

Figure 1:
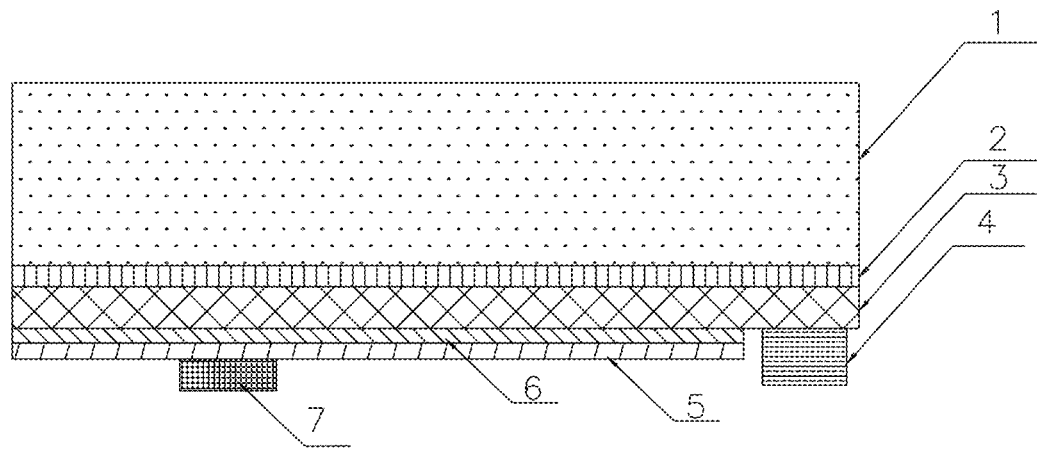
FIG. 1 is a first state diagram of a light purification method for an LED according to an implementation of the disclosure.

In these figures: 1—sapphire substrate, 2—u-GaN layer, 3—N-type GaN layer, 4—N-PAD, 5—P-type GaN, 6—MQW layer, 7—P-PAD, 8—first reflection layer, 9—second reflection layer, 10—light-exiting hole.

DETAILED DESCRIPTION

The implementations of the present disclosure will be described in detail below with reference to the accompanying drawings.

The following describes the implementation of the present disclosure through specific examples, and those skilled in the art can easily understand other advantages and effects of the present disclosure from the content disclosed in this specification. Obviously, the described implementations are only a part rather than all of the implementations. The present disclosure can also be implemented or applied through other different implementations, and various details in this specification can also be modified or changed based on different viewpoints and applications without departing from the spirit of the present disclosure. It should be noted that, in the case of no conflict, the following implementations and the features thereof can be combined with each other. Based on the implementations in the present disclosure, all other implementations obtained by those of ordinary skill in the art without creative work shall fall within the protection scope of the present disclosure.

It should be noted that various aspects of the implementations within the scope of the appended claims are described below. It should be obvious that the aspects described herein can be embodied in a wide variety of forms, and any specific structure and/or function described herein are only illustrative. Based on the present disclosure, those skilled in the art should understand that one aspect described herein can be implemented independently of any other aspects, and two or more of these aspects can be combined in various ways. For example, any number of aspects set forth herein can be used to implement devices and/or methods of practice. In addition, structures and/or functionalities other than one or more of the aspects set forth herein may be used to implement this device and/or practice this method.

It should also be noted that the illustrations provided in the following implementations only illustrate the basic idea of the present disclosure in a schematic manner. The figures only show the components related to the present disclosure, and are not drawn based on the number, shape, and size of the components in actual implementation. During actual implementation, the type, quantity, and proportion of each component may be changed at will and the component layout type may also be more complicated.

In addition, in the following description, specific details are provided to facilitate a thorough understanding of the examples. However, those skilled in the art will understand that the aspects can be practiced without these specific details.

Implementations of the disclosure provide a light purification method for a light emitting diode (LED).

Referring to FIG. 1 to FIG. 6 and FIG. 11, the light purification method for the LED includes the following.

At S101, a light purification layer is formed on an epitaxial structure of the LED.

For example, the light purification layer may be formed on the epitaxial structure through evaporation or deposition.

Of course, in practice, the light purification layer may also be formed on the epitaxial structure of the LED through other means, which is not limited herein.

It should be understood that the LED is provided with the epitaxial structure (for example, the epitaxial structure may include a first type semiconductor layer, a light-emitting layer, and a second type semiconductor layer, which is not limited herein).

As an implementation, the epitaxial structure is removed from a substrate (or a growth substrate), that is, the substrate is peeled off by means of laser lift-off, leaving the epitaxial structure. After removal, the light purification layer is formed on the epitaxial structure by a process of evaporation or sputtering.

At S102, the light purification layer is patterned to form multiple light-exiting holes. The multiple light-exiting holes each extend through the light purification layer and have an aperture which is N times a preset wavelength of an exit light, N being an integer and The light purification layer is processed using a designed template. For example, the light purification layer is etched to obtain multiple light-exiting holes. The light-exiting holes are designed to extract a required light. Each of the light-exiting holes has the aperture which is N times a preset wavelength of an exit light, N being an integer and According to the LED obtained by the light purification method of the disclosure, the unwanted light is filtered out by the light purification layer and total reflection occurs in channels of light-exiting holes under an optical waveguide principle, so that the light with required wavelength is directed out, achieving a high color rendering index and improving the purity of light.

In the implementations of the disclosure, the epitaxial structure includes a sapphire substrate 1, a U-type gallium nitride (GaN) layer, an n-type GaN layer 3, a multiquantum well (MQW) layer 6, a P-type GaN layer 5, an N-PAD4 (N-type electrode), and a P-PAD7 (P-type electrode). The epitaxial structure in this implementation is only an example description provided by the present disclosure, and the epitaxial structure may also have other forms, which are not limited herein.

Figure 2:
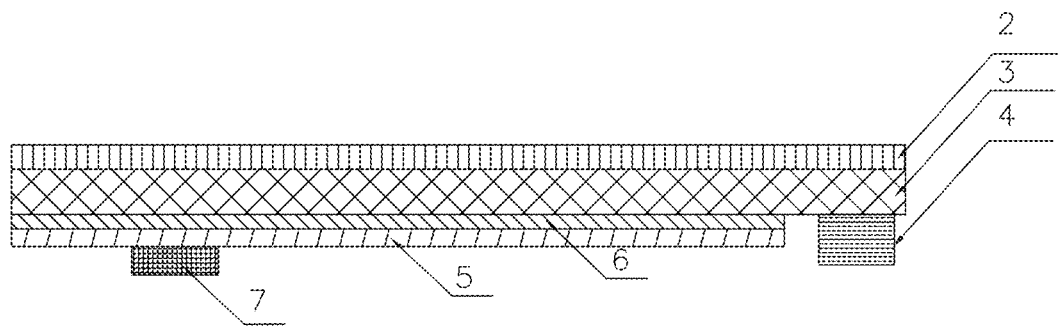
FIG. 2 is a second state diagram of the light purification method for the LED according to the implementation of the disclosure.
Figure 3:
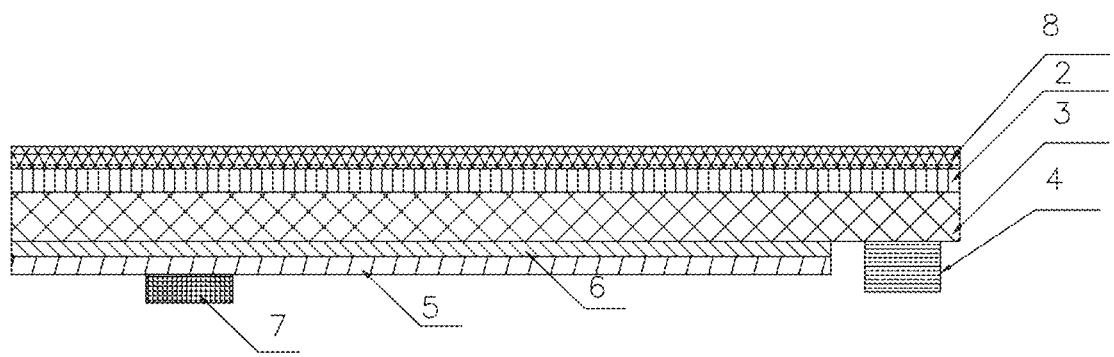
FIG. 3 is a third state diagram of the light purification method for the LED according to the implementation of the disclosure.
Figure 4:
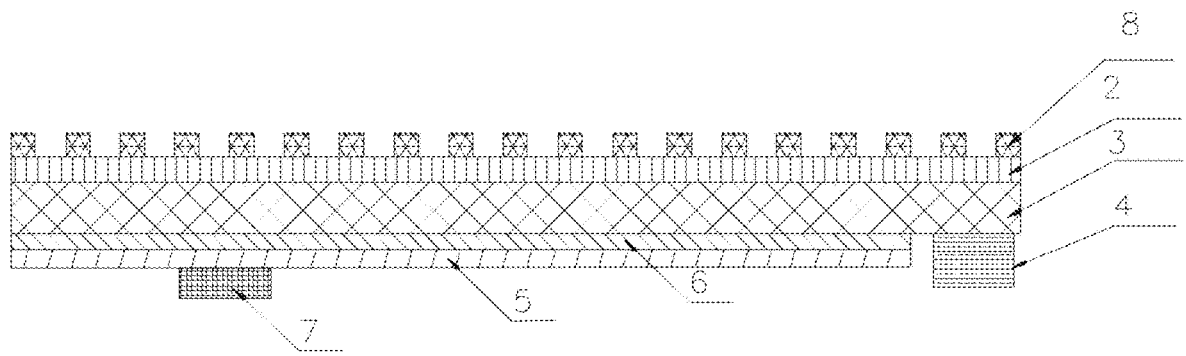
FIG. 4 is a fourth state diagram of the light purification method for the LED according to the implementation of the disclosure.

To obtain the structure for light purification of the implementations of the disclosure, referring to FIG. 1 to FIG. 6, the sapphire substrate 1 is removed by using the surface-emitting laser to obtain the structure in FIG. 2. Removing the sapphire substrate 1 can reduce the adverse effects caused by the low heat dissipation efficiency of the sapphire substrate 1. A material with good heat dissipation effect is used instead as the light purification layer to improve the heat dissipation efficiency. The structure of the light purification layer are then prepared on the outermost layer of the epitaxial structure. In this implementation, the outermost layer of the epitaxial structure is the u-GaN layer 2, so the light purification layer is prepared on the u-GaN layer 2.

In some implementations, the light purification layer includes a first reflection layer 8 and a second reflection layer 9. The first reflection layer 8 may be made of a material with high reflectance, such as aluminium (Al), mercury, or other high-reflectance metals. The first reflection layer in this structure is used to filter out unwanted lights. In one implementation, the first reflection layer is made of Al which has a high reflectance and low cost, and coating may be completed by using evaporation technology. In the implementations, an Al film is sputtered on the u-GaN layer 2 by sputtering coating, or an Al film is coated on the u-GaN layer 2 by E-GUN (electron gun) spraying. The Al film may have a thickness of 2000 Å~3000 Å, but of course it is not limited to this range. By coating the Al film on the u-GaN layer 2, the unwanted lights can be filtered out at this layer. After completion of the Al film, a second reflection layer 9 may be plated on the Al layer by sputtering coating. A material of the second reflective layer 9 is different from that of the first reflective layer 8. Aluminum nitride (AlN), silicon carbide (SiC), gallium arsenide (GaAs), and other substrate materials with good heat dissipation performance may be selected.

Figure 5:
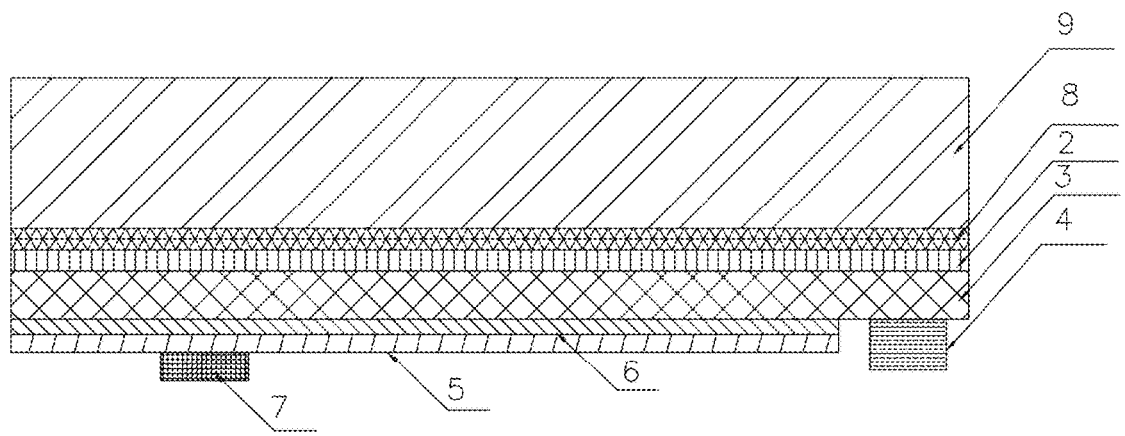
FIG. 5 is a state diagram of a light purification method for an LED according to another implementation of the disclosure.

The implementations of the present disclosure realize the light purification effect by using the principle of optical waveguide, that is, a guiding structure formed by an optically transparent medium (such as quartz glass) for transmitting optical frequency electromagnetic waves. The transmission principle of the optical waveguide is that on the interface of the media with different refractive indexes, the total reflection of electromagnetic waves causes the light waves to propagate in the waveguide and the limited area around it. The principle of optical waveguide is used to direct out a light with a required wavelength to achieve high color rendering. Because light is a kind of electromagnetic wave, light will be confined to a specific space to achieve total reflection at a specific wavelength and specific space. On the structure with the Al layer and the AlN layer obtained above, yellow light is used to develop and expose the required image on the AlN layer. The required image is the structure required by the light-exiting holes 10. Then the required pattern is formed by etching. As shown in FIG. 5, the light-exiting holes 10 obtained by etching penetrate the AlN and Al layers. The size of the light-exiting holes 10 needs to be designed according to the required wavelength of the exit light, and the size of the light-exiting holes 10 is N times the wavelength of the light to be output. For example, the light-exiting hole may have an aperture of 460 nm. There may by multiple light-exiting holes, which are arranged at equal intervals. In addition, the distance between two adjacent light-exiting holes is not equal to N times of 460 nm.

Based on the light purification method above, the implementations of the disclosure further provide an LED. As illustrated in FIG. 4 to FIG. 8, the LED includes an epitaxial structure and a light purification layer plated on the epitaxial structure. The light purification layer includes a first reflection layer and defines multiple light-exiting holes. The first reflection layer is plated on the epitaxial structure. The multiple light-exiting holes each extend through the first reflection layer and have an aperture which is N times a preset wavelength of an exit light, N being an integer and N≥1.

According to the solution of the disclosure, the unwanted light is filtered out by the first reflection layer 8 and total reflection occurs in channels of light-exiting holes under an optical waveguide principle, so that the light with required wavelength is directed out, achieving a high color rendering index and improving the purity of light.

In one implementation of the disclosure, the epitaxial structure includes a sapphire substrate 1, a U-type GaN layer, an N-type GaN layer 3, an MQW layer 6, and a P-type GaN layer 5.

It should be noted that the epitaxial structure in this implementation is only an example, and the epitaxial structure may also have other forms. For example, in another implementation, the epitaxial structure may also include a sapphire substrate, a U-type GaN layer, an N-type GaN layer, an MQW layer, an electron blocking layer, and a P-type GAN layer. The N-type GaN layer includes a thin N—GaN layer with a thinner growth thickness and a thick N—GaN layer with a thicker growth thickness. The thin N—GaN layer and the thick N—GaN layer are grown alternately, or the thick N—GaN layer and the thin N—GaN layer are grown alternately. The alternate growth period is 5 to 45 periods. The N-type GaN is doped with Si element. The N—GaN layer blue LED epitaxial structure adopting this structure can not only reduce the turn-on voltage, but also improve the antistatic ability and effectively improve the brightness of the LED.

With reference to the light purification layer structure shown in FIGS. 6 and 7, the formation of the optical path will be described based on the structure. The light generated from the MQW layer 6 passes through the n-GaN layer 3 and the u-GaN layer 2 to reach the light purification layer, and the wavelength of the light generated from the MQW layer 6 is ranged from 455 nm to 465 nm. At the light purification layer, due to the addition of the first reflection layer, the light emitted from the u-GaN is reflected back on the first reflective layer 8. In order to obtain the required exit light, the light purification layer also defines light-exiting holes, which are obtained by etching on the first reflection layer. With aid of the light-exiting holes, only the light that meets the exit condition at the light-exiting hole 10 will exit from the light-exiting holes 10, and the light that can exit is associated with the size of the light-exiting holes 10. For example, if the wavelength of the light that needs to be output is 460 nm, the size of the light-exiting holes 10 may be set to an integer multiple of 460 nm, so that the wavelength of the exit light can be limited to around 460 nm, such as 458 nm~462 nm. Therefore, the light purification layer structure according to the implementations of the disclosure can limit the wavelength of the light exiting toward a front direction to around 460 nm. Because total reflection occurs to the light in a specific space, for light with a wavelength of 455 nm or a wavelength of 465 nm, both are not in condition for total reflection. Therefore, in a certain path, the light will exit in other angles due to refraction, or will not exit at all due to refraction and will be converted into heat energy, that is, there will be loss of light. Therefore, the wavelength of the light exit in the front is limited to around 460 nm.

In this implementation, the first reflection layer 8 is made of Al. High-reflectance metals, such as Al, copper, and the like, may be used to form the first reflection layer 8.

In other implementations, the epitaxial structure may not include a U-type GaN layer (that is, an undoped gallium nitride layer). That is, the epitaxial structure includes a sapphire substrate 1, an N-type GaN layer 3, an MQW layer 6, and a P-type GaN layer 5. The first reflection layer is plated on the N-type GaN layer 3, and the optical path of the exit light is from the MQW layer 6 generating the light through the n-GaN layer 3 to the light purification layer, finally reaching the human eye.

Figure 6:
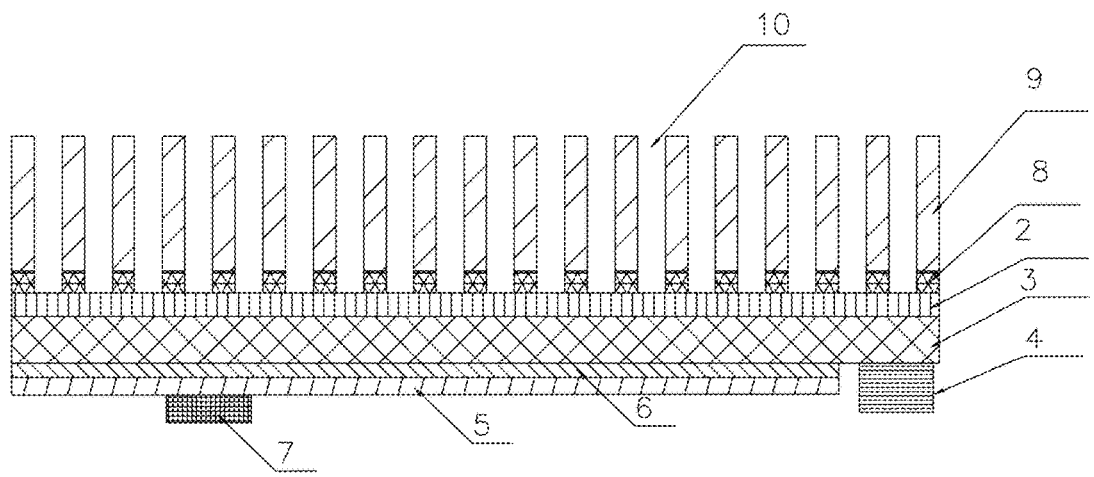
FIG. 6 is a state diagram illustrating the LED of FIG. 5 with etched optical holes.
Figure 7:
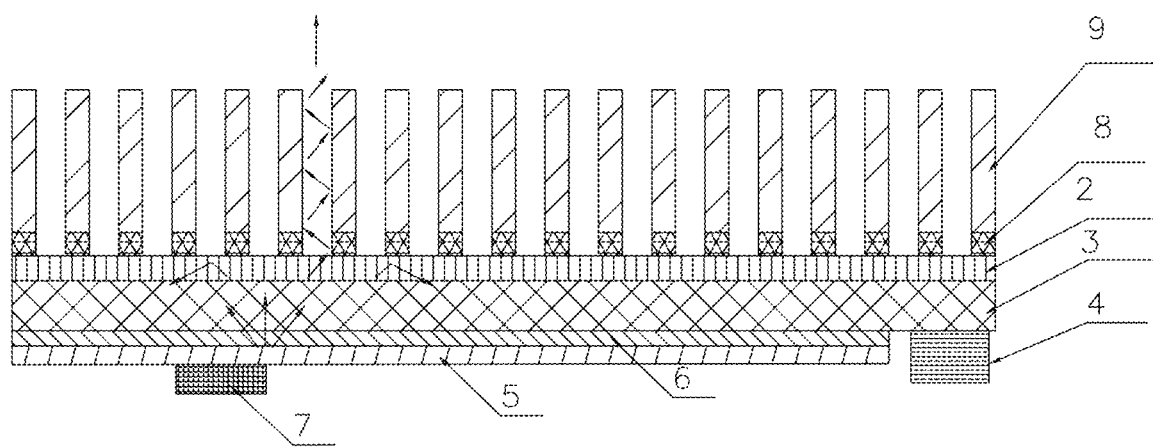
FIG. 7 is an optical path diagram of an LED according to implementations of the disclosure.
Figure 8:
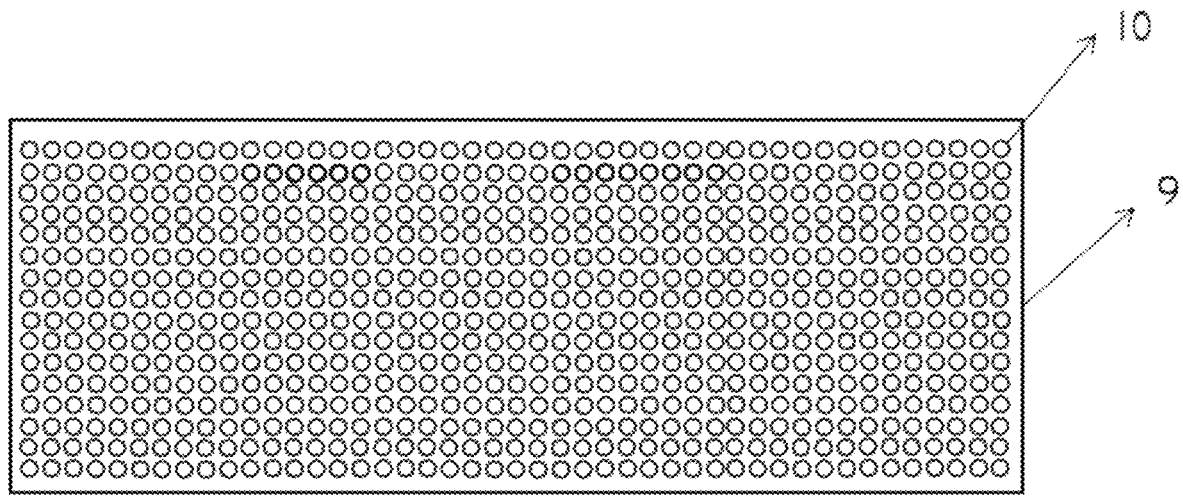
FIG. 8 is a top view of an LED according to implementations of the disclosure.

In another implementation of the disclosure, as shown in FIG. 5 and FIG. 6, the light purification layer further includes a second reflection layer plated on the first reflection layer. The light-exiting holes each extend through the second reflection layer and the first reflection layer. The second reflection layer 9 is made of AlN. The material of the second reflection layer 9 can also be selected from SiC, GaAs, and other substrate materials with good heat dissipation performance. The sapphire substrate 1 is removed and AlN is selected to improve the heat dissipation efficiency and reduce the influence of heat.

In addition, the thickness of the second reflective layer 9 is 20-40 um. In one example, the thickness is 30 um. It should be noted that the height of the second reflective layer is greater than the height of the first reflective layer. In one example, the thickness of the first reflective layer is 2000 Å to 3000 Å.

Further, the light-exiting holes 10 each have a circular shape. The selection of the circular light-exiting holes 10 makes the light purification effect obtained by adopting the light purification structure of the implementations better. Of course, in other implementations, light-exiting holes 10 of other shapes can also be selected, such as square light-exiting holes 10, hexagonal light-exiting holes 10, and so on.

According to the solution of the disclosure, the unwanted light is filtered out by the first reflection layer and total reflection occurs in channels of light-exiting holes under an optical waveguide principle, so that the light with required wavelength is directed out, achieving a high color rendering index and improving the purity of light.

Figure 9:
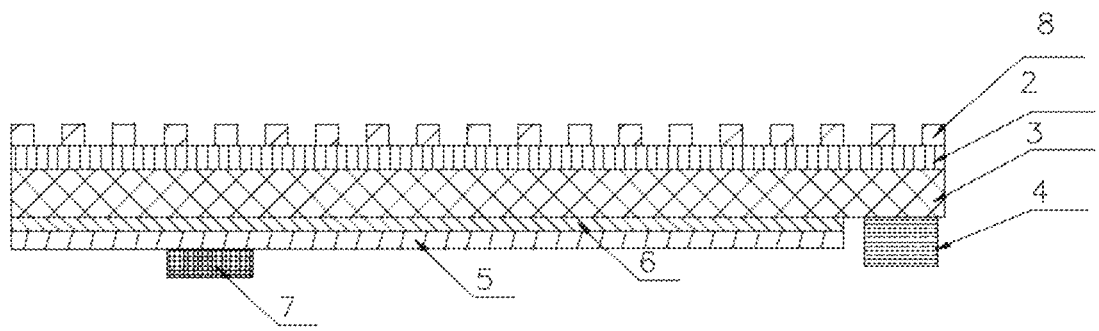
FIG. 9 is a schematic structural diagram of an LED according to another implementation of the disclosure.

In another implementation, as illustrated in FIG. 9, the LED includes an epitaxial structure and a light purification layer plated on the epitaxial structure. The light purification layer includes a first reflection layer and defining multiple light-exiting holes. The first reflection layer is plated on the epitaxial structure. The multiple light-exiting holes each extend through the first reflection layer and have an aperture which is N times a preset wavelength of an exit light, N being an integer and N≥1. The first reflection layer is an AlN layer.

In this implementation, the first reflection layer is made of AlN. Similarly, the epitaxial structure includes a sapphire substrate 1, a U-type GaN layer, an N-type GaN layer 3, an MQW layer 6, and a P-type GaN layer 5. The light generated from the MQW layer 6 passes through the N—GaN layer 3 and the u-GaN layer 2 to reach the AlN reflection layer. The wavelength of the light generated from the MQW layer 6 is ranged from 455 nm to 465 nm. Part of the light passing through the AlN reflection layer will be reflected, so that the light output from the light-exiting hole is purified.

Figure 10:
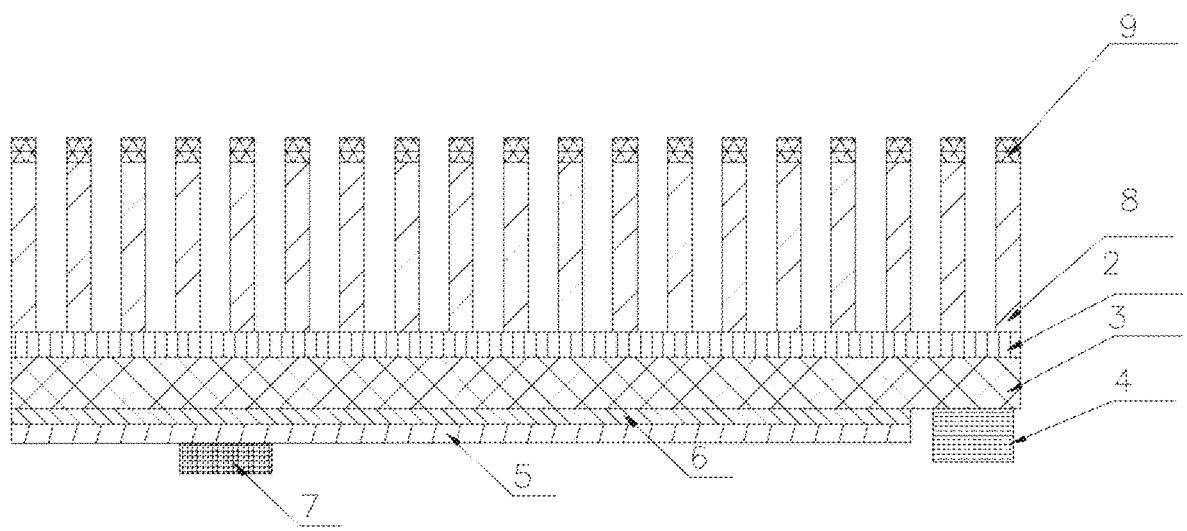
FIG. 10 is a schematic structural diagram of an LED according to another implementation of the disclosure.
Figure 11:
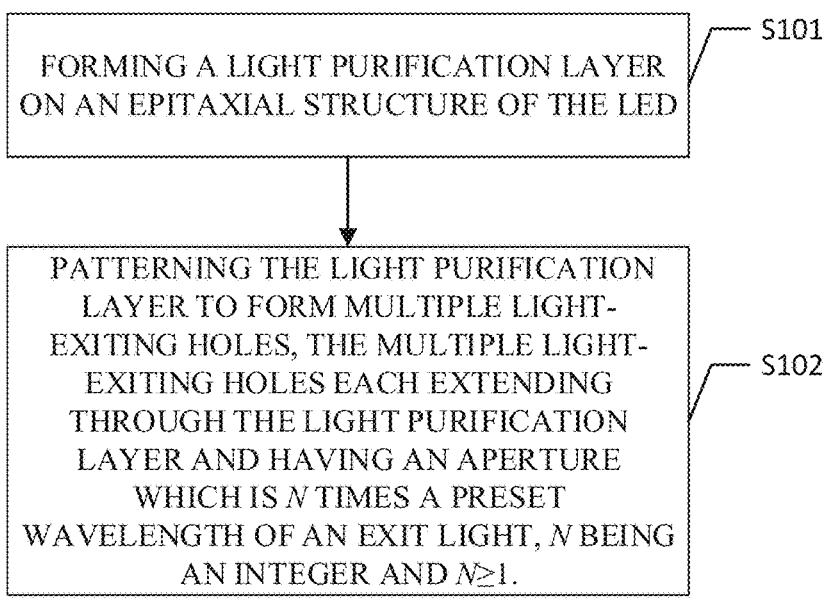
FIG. 11 is a flow chart of a light purification method for an LED according to implementations of the disclosure.

In addition, as shown in FIG. 10, in this implementation, the light purification layer further includes a second reflection layer plated on the first reflection layer. Each of the light-exiting holes extends through the second reflection layer and the first reflection layer. The second reflective layer is an Al layer. The height of the second reflection layer is smaller than the height of the first reflection layer.

According to the solution of the implementations of the disclosure, the unwanted light is filtered out by the light purification layer and total reflection occurs in channels of light-exiting holes under an optical waveguide principle, so that the light with required wavelength is directed out, achieving a high color rendering index and improving the purity of light.

The above are only some implementations of the present disclosure, but the protection scope of the present disclosure is not limited thereto. Any change or substitution that can be easily conceived by those skilled in the art within the technical scope disclosed in the present disclosure are all covered within the protection scope of the present disclosure. Therefore, the protection scope of the present disclosure should be subject to the protection scope of the claims.

What is claimed is:

1. Alight emitting diode (LED), comprising:
an epitaxial structure; and
a light purification layer plated on the epitaxial structure, the light purification layer comprising a first reflection layer and defining a plurality of light-exiting holes, the first reflection layer being plated on the epitaxial structure, the plurality of light-exiting holes each extending through the first reflection layer and having an aperture which is N times a preset wavelength of an exit light, N being an integer and N≥1.

2. The LED of claim 1, wherein the first reflection layer is an aluminum (Al) layer.

3. The LED of claim 2, wherein the light purification layer further comprises a second reflection layer plated on the first reflection layer, and the plurality of light-exiting holes each extend through the second reflection layer and the first reflection layer.

4. The LED of claim 3, wherein the second reflection layer is an aluminum nitride (AlN) layer.

5. The LED of claim 4, wherein the second reflection layer has a height greater than the first reflection layer.

6. The LED of claim 1, wherein the first reflection layer is an AlN layer.

7. The LED of claim 6, wherein the light purification layer further comprises a second reflection layer plated on the first reflection layer, and the plurality of light-exiting holes each extends through the second reflection layer and the first reflection layer.

8. The LED of claim 7, wherein the second reflection layer is an Al layer.

9. The LED of claim 8, wherein the second reflection layer has a height less than the first reflection layer.

10. The LED of claim 1, wherein a distance between two adjacent light-exiting holes is not equal to N times the preset wavelength of the exit light.

11. The LED of claim 1, wherein the epitaxial structure comprises a sapphire substrate, a U-type gallium nitride (GaN) layer, an n-type GaN layer, a multiquantum well (MQW) layer, and a P-type GaN layer.

12. The LED of claim 1, wherein the epitaxial structure comprises a sapphire substrate, an n-type GaN layer, an MQW layer, and a P-type GaN layer.

13. An light purification method for a light emitting diode (LED), comprising:
forming a light purification layer on an epitaxial structure of the LED; and
patterning the light purification layer to form a plurality of light-exiting holes each extending through the light purification layer, wherein each of the plurality of light-exiting holes has an aperture which is N times a preset wavelength of an exit light, N being an integer and N≥1.

14. The light purification method for LED of claim 13, wherein forming the light purification layer on the epitaxial structure of the LED comprising:
  plating a first reflection layer on the epitaxial structure of the LED; and
  plating a second reflection layer on the first reflection layer to form the light purification layer.

15. The light purification method for LED of claim 14, wherein patterning the light purification layer to form the plurality of light-exiting holes comprising:
  patterning the second reflection layer and the first reflection layer to form the plurality of light-exiting holes each extending through the second reflection layer and the first reflection layer.

16. The light purification method for LED of claim 13, wherein forming the light purification layer on the epitaxial structure of the LED comprises:
  removing the epitaxial structure from a substrate; and
  forming the light purification layer on the epitaxial structure through evaporation or sputtering.

* * * * *